United States Patent
Owaki et al.

(10) Patent No.: US 7,750,533 B2
(45) Date of Patent: Jul. 6, 2010

(54) SURFACE ACOUSTIC WAVE (SAW) DEVICE, MODULE AND OSCILLATOR FOR IMPROVING A Q FACTOR

(75) Inventors: Takuya Owaki, Chigasaki (JP); Takao Morita, Fujisawa (JP)

(73) Assignee: Epson Toyocom Corporation, Tokyo (JP)

(*) Notice: Subject to any disclaimer, the term of this patent is extended or adjusted under 35 U.S.C. 154(b) by 205 days.

(21) Appl. No.: 11/922,408

(22) PCT Filed: Jun. 15, 2006

(86) PCT No.: PCT/JP2006/312464

§ 371 (c)(1),
(2), (4) Date: Dec. 18, 2007

(87) PCT Pub. No.: WO2006/137464

PCT Pub. Date: Dec. 28, 2006

(65) Prior Publication Data

US 2009/0021108 A1    Jan. 22, 2009

(30) Foreign Application Priority Data

Jun. 21, 2005  (JP)  ............................. 2005-180329

(51) Int. Cl.
H03H 9/125  (2006.01)
(52) U.S. Cl. .................. 310/313 B; 310/313 R
(58) Field of Classification Search ............... 310/313
See application file for complete search history.

(56) References Cited

U.S. PATENT DOCUMENTS 4,159,435 A    6/1979    Lewis (Continued)

FOREIGN PATENT DOCUMENTS

JP    A 57-099813    6/1982

(Continued)

OTHER PUBLICATIONS

Owaki T. et al., "Excellent Frequency Stability and Small SH-type Quartz SAW Resonators," The Institute of Electronics, Information and Communication Engineers Sogo Taikai Koen Ronbunshu, Mar. 7, 2005, vol. 2005, p. 223.

(Continued)

Primary Examiner—J. SanMartin
(74) Attorney, Agent, or Firm—Oliff & Berridge, PLC

(57) ABSTRACT

[Problem] In a SAW device using a quartz crystal substrate, prevent the deterioration of Q factor due to the difference in the peak frequency between the radiation conductance of an IDT and the reflection coefficient of a reflector.

[Means to Solve the Problem]

A surface acoustic wave (SAW) device includes a piezoelectric substrate made of a quartz crystal flat plate where a cut angle of a rotated Y-cut quartz substrate is set in $-64.0° < \theta < -49.3°$ with a crystalline Z axis and a propagation direction of the surface acoustic wave is set at $90° \pm 5°$ with a crystalline X axis, an interdigital transducer (IDT) formed on the piezoelectric substrate and reflectors disposed at both sides of the IDT, wherein an exciting wave is SH wave, an electrode film thickness "$H/\lambda$" normalized by a wavelength of the IDT is $0.05 \leq H/\lambda \leq 0.07$ where "$\lambda$" is a wavelength of the exciting SAW, and a ratio of an electrode pitch between the IDT and the reflector "Lt/Lr" is set to satisfy the following formula: $31.50 \times (H/\lambda)^2 - 4.435 \times (H/\lambda) + 1.133 \leq Lt/Lr \leq -3.000 \times (H/\lambda)^2 + 0.500 \times (H/\lambda) + 0.9796$ where "Lt" is the electrode pitch of the IDT and "Lr" is the electrode pitch of the reflector.

6 Claims, 4 Drawing Sheets

U.S. PATENT DOCUMENTS

| | | | |
|---|---|---|---|
| 4,387,355 A | 6/1983 | Uno et al. | |
| 5,895,996 A * | 4/1999 | Takagi et al. | 310/313 R |
| 6,137,380 A * | 10/2000 | Ushiroku et al. | 333/193 |
| 6,329,888 B1 * | 12/2001 | Hirota | 333/193 |
| 6,603,371 B2 * | 8/2003 | Nakao et al. | 333/193 |
| 6,815,870 B2 * | 11/2004 | Shibata et al. | 310/313 R |
| 6,856,218 B2 * | 2/2005 | Yamazaki et al. | 333/193 |
| 7,042,133 B2 * | 5/2006 | Kanna | 310/313 A |
| 7,456,705 B2 * | 11/2008 | Ito | 333/133 |
| 7,479,854 B2 * | 1/2009 | Takamine | 333/195 |
| 7,589,451 B2 * | 9/2009 | Morita et al. | 310/313 R |

FOREIGN PATENT DOCUMENTS

| | | |
|---|---|---|
| JP | A 60-213110 | 10/1985 |
| JP | B2 62-16050 | 4/1987 |
| JP | B2 01-34411 | 7/1989 |
| JP | A 10-145167 | 5/1998 |
| JP | A 2004-310452 | 11/2004 |
| WO | WO 2005/099089 A1 | 10/2005 |

OTHER PUBLICATIONS

Lewis M., "Surface Skimming Bulk Wave, SSBW," IEEE Ultrasonics Symp. Proc., 1977, pp. 744-752.

* cited by examiner (a)

(b)

(a)

(b)

SURFACE ACOUSTIC WAVE (SAW) DEVICE, MODULE AND OSCILLATOR FOR IMPROVING A Q FACTOR

TECHNICAL FIELD

The present invention relates to a Surface Acoustic Wave (SAW) device that uses a quartz crystal substrate and aims to improve a Q factor in the SAW device. The invention also relates to a module and an oscillator.

BACKGROUND

In recent years, Surface Acoustic Wave (hereinafter referred to as SAW) devices have been widely used as components for mobile communication terminals, in-car equipments and the like. For such SAW devices, there are strong requests such as downsizing, a high Q factor and fine frequency-temperature characteristics.

As a SAW device which can meet the above-mentioned requests, there is a SAW device using a ST-cut quartz crystal substrate. The ST-cut quartz substrate is a cut name of a quartz crystal substrate having a XZ' plane obtained by rotating a XZ-plane counterclockwise from the crystalline Z-axis by 42.75° around the crystalline X-axis. A (P+SV) wave propagating in the crystalline X-axis direction called Rayleigh wave is utilized as a surface acoustic wave (hereinafter referred as "ST-cut quartz crystal SAW") in the ST-cut quartz crystal substrate. This SAW is utilized in the ST-cut SAW device. There are a wide range of applications of the ST-cut quartz crystal SAW device including a SAW resonator which is used as an oscillator and an IF filter disposed between an RF component and an IC in a mobile communication terminal.

One of the reasons why the ST-cut quartz crystal SAW device can realize a small-sized and high Q factor device is that the SAW reflection is efficiently utilized. Taking the ST-cut quartz crystal SAW resonator shown in FIG. 4 for example, the ST-cut quartz crystal SAW resonator a structure in which an interdigital transducer (hereinafter referred to as ITD) 102 having a plurality of electrode fingers interdigitating each other is disposed on a ST-cut quartz crystal substrate 101 and grating reflectors 103a, 103b reflecting SAW are respectively disposed at the both sides of the ITD 102. The ST-cut quartz crystal SAW propagates along the surface of a piezoelectric substrate and it is efficiently reflected by the grating reflectors 103a, 103b. Accordingly the energy of the SAW is sufficiently confined within the IDT 102 and this makes it possible to obtain the small-sized and high Q-factor device.

Meanwhile as an important factor in use of the SAW device, there is a frequency-temperature characteristic. In the case of the above-mentioned ST-cut quartz crystal SAW device, a first-order temperature coefficient of the frequency-temperature characteristic is zero so that the characteristic is represented by a quadratic curve when it is plotted. The amount of the variation in the frequency can be decreased significantly if the frequency-temperature characteristic is adjusted such that the peak temperature is to be located at the center of an operating temperature range. In this sense, it is commonly known that the ST-cut quartz crystal SAW device has a fine frequency stability.

Though the first-order temperature coefficient of the above-mentioned ST-cut quartz crystal SAW device is zero, the second-order temperature coefficient is $-0.034$ ppm/° $C.^2$, which is relatively large. This can be a problem that the amount of the variation in the frequency becomes extremely large when the operating temperature range is expanded.

A saw device which can solve the above-mentioned problem was disclosed in Meirion Lewis, "Surface Skimming Bulk Wave, SSBW", IEEE Ultrasonics Symp. Proc., pp. 744-752 (1977) and JP-B-62-016050. Referring to FIG. 5, a feature of this SAW device is that a cut angle "θ" of a rotated Y-cut quartz crystal substrate is set to about −50° rotated counterclockwise from the crystalline Z axis and the propagation direction of the SAW is set to the perpendicular direction (Z'-axis direction) with respect to the crystalline X axis. When the cut angle is expressed in Eular angle, the above-mentioned cut angle is (0°, θ+90°, 90°)=(0°, 40°, 90°). In this SAW device, a SH wave propagating just below the surface of the piezoelectric substrate is excited by the IDT, and the vibration energy is confined right under the electrodes. The frequency-temperature characteristic of the SAW device is expressed as a cubic curve and the variation in frequency becomes very small in the operating temperature range. In this sense, a fine frequency-temperature characteristic can be obtained.

However the SH wave generally propagates inside the substrate so that its reflection efficiency by the grating reflector is low compared with that of the ST-cut quartz crystal SAW that propagates along the surface of the piezoelectric substrate. For this reason, it is difficult to realize the small-sized high-Q SAW device. The above-mentioned prior literatures disclosed the application to a delay line that does not use the SAW reflection. However the prior literatures do not propose any application of the SAW reflection to devices and practical applications to the oscillation element and the filter element have been considered to be very difficult.

JP-B-01-034411 discloses a so-called multiple-pairs IDT type SAW resonator. Referring to FIG. 6, an IDT 112 having 800±200 pairs of electrodes is formed on a piezoelectric substrate 111 in which the cut angle "θ" of the rotated Y-cut quartz crystal substrate is set to about −50° and the propagation direction of SAW is set to the perpendicular direction (Z'-axis direction) with respect to the crystalline X-axis in the multiple-pairs IDT type SAW resonator. By providing a large number of the electrode pairs in the IDT 112, the multiple-pairs IDT type SAW resonator confines the SAW energy only by the reflection of the IDT 112 itself and without using the grating reflector, aiming to obtain a high Q factor.

However the multiple-pairs IDT type SAW resonator cannot confine the energy as efficiently as the SAW resonator with the grating reflector can. Accordingly the number of the pairs of IDT electrodes required to obtain a high level of the Q factor becomes as large as 800±200. This means that the device size exceeds that of the ST-cut quartz crystal SAW resonator and it cannot meet the request of downsizing.

According to JP-B-01-034411, it is said that the level of the Q factor can be raised by setting an electrode film thickness in 2% λ or larger and preferably equal to or smaller than 4% λ where "λ" is a wavelength of the SAW which is excited by the IDT. In this case when the resonance frequency is 200 MHz, the Q factor reaches the highest where the electrode film thickness is around 4% λ. However the highest value of the Q factor is only about 20,000, which is about the same as that of the ST-cut quartz crystal SAW resonator. This may be caused by the inefficient use of the reflection because the SAW is not sufficiently accumulated on the surface of the piezoelectric substrate where the film thickness lies in the range of 2-4% λ.

Considering the above-mentioned facts, in Japanese Patent Application No. 2004-310452, the inventor proposed a SAW device having a quartz crystal flat plate and an IDT that is made of Al or alloy containing Al as a main component and formed on the quartz crystal flat plate, and where the cut angle "θ" of the rotated Y-cut quartz substrate is set within a range of −64.0°<θ<−49.3°, more preferably −61.4°<θ<−51.1°, counterclockwise with the crystalline Z axis, the propagation direction of the SAW is set at 90°±5° with respect to the crystalline X axis, and an electrode film thickness "H/λ" which is the electrode film thickness normalized by the wavelength of the SAW in the IDT is set in a range of 0.04<H/λ<0.12, more preferably 0.05<H/λ<0.10. According to this invention, the wave which normally propagates inside the piezoelectric substrate can be concentrated to the surface of the substrate and the SAW can be sufficiently reflected by the grating reflector or the like. Thereby it is possible to realize the small-sized SAW device that has a better frequency-temperature characteristic and a higher Q factor compared to those of the hitherto known ST-cut quartz crystal SAW device.

Meanwhile, for obtaining a higher Q factor, it is important to reduce vibration loss as much as possible by confining the vibration energy of the SAW in the surface of the piezoelectric substrate. To achieve this, a peak frequency of a radiation conductance of the IDT has to be matched with a peak frequency of a reflection coefficient of the reflector. FIG. 7 shows a radiation conductance "G" and a reflection coefficient "|Γ|" of the reflector at the point where an electrode pitch "Lt" of the IDT is sized equal to an electrode pitch "Lr" of the reflector (Lt=Lr). It can be seen from the graph in the drawing that a peak frequency "ft" of the radiation conductance "G" of the IDT occurs at a different position from where a peak frequency "fr" of the reflection coefficient "|Γ|" of the reflector occurs. This indicates that a sufficient reflection state cannot be obtained at the center frequency of the IDT, which contributes to the deterioration of the Q factor.

The ratio of the electrode pitch "Lt/Lr" between the IDT and the reflector is needed to be adjusted in order to square the peak frequency "ft" with the peak frequency "fr". The correction value of the ratio "Lt/Lr" varies according to the cut-angle of the piezoelectric substrate and the film thickness of the electrode therefore the ratio "Lt/Lr" should be appropriately selected depending on the design conditions, otherwise the peak frequency "ft" and the peak frequency "fr" cannot be matched and the Q factor is deteriorated. Accordingly the optimum value of the ratio "Lt/Lr" where the peak frequency "ft" square with the peak frequency "fr" should be examined for the SAW device disclosed in Japanese Patent Application No. 2004-310452.

The present invention has been achieved to eliminate the above-mentioned drawbacks and aims to obtain a high Q factor for the SAW device disclosed in Japanese Patent Application No. 2004-310452 by setting the ratio of the electrode pitch "Lt/Lr" between the IDT and the reflector appropriately and matching the peak frequency of the radiation conductance of the IDT with the peak frequency of the reflection coefficient of the reflector.

DISCLOSURE OF THE INVENTION

A surface acoustic wave (SAW) device according to the invention includes a piezoelectric substrate made of a quartz crystal flat plate where a cut angle of a rotated Y-cut quartz substrate is set in −64.0°<θ<−49.3° with a crystalline Z-axis and a propagation direction of the surface acoustic wave is set at 90°±5° with a crystalline X axis, at least one interdigital transducer (IDT) formed on the piezoelectric substrate and reflectors disposed at both sides of the IDT, wherein an exciting wave is SH wave, an electrode film thickness "H/λ" normalized by a wavelength of the IDT is 0.05≦H/λ≦0.07 where "λ" is a wavelength of the exciting SAW, and a ratio of an electrode pitch between the IDT and the reflector "Lt/Lr" is set to satisfy the following formula: $31.50\times(H/\lambda)^2-4.435\times(H/\lambda)+1.133 \leq Lt/Lr \leq -3.000\times(H/\lambda)^2+0.500\times(H/\lambda)+0.9796$ where "Lt" is the electrode pitch of the IDT and "Lr" is the electrode pitch of the reflector.

In this case, the IDT and the reflectors may be made of Al or an Al-based alloy.

A module according to the invention includes the above-described SAW device.

An oscillator according to the invention includes the above-described SAW device.

DESCRIPTION OF THE PREFERRED EMBODIMENT

Figure 1:
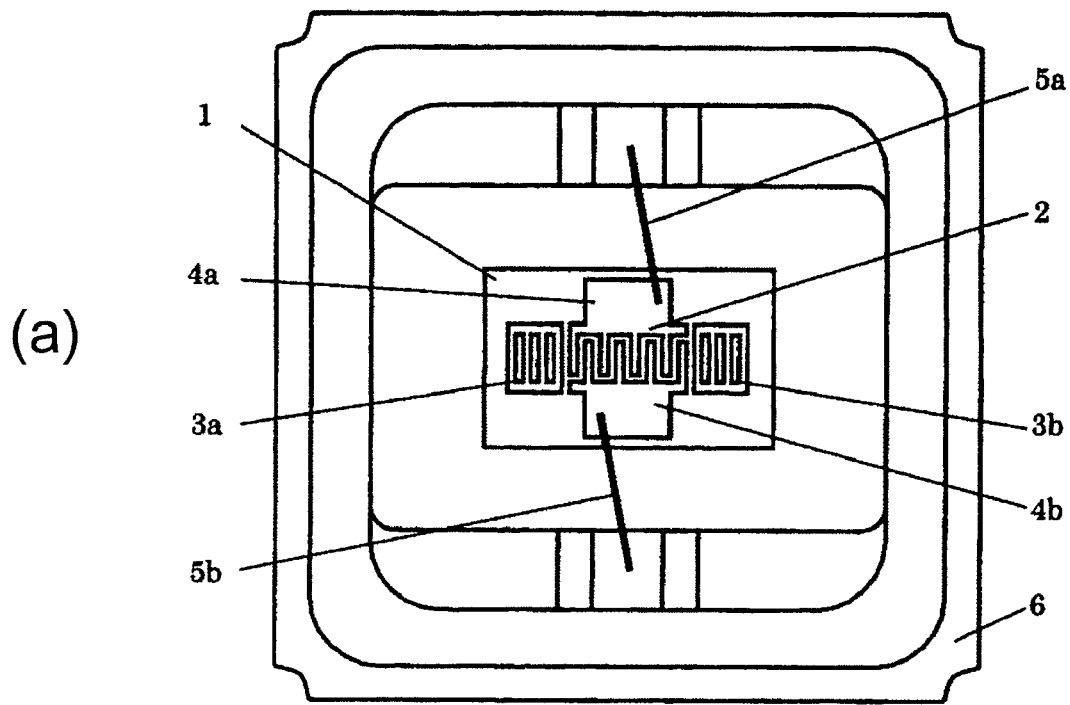
FIG. 1(a) is a plan view of a SAW resonator which is an example of a SAW device according to the invention and FIG. 1(b) is an enlarged view of an electrode part.
Figure 1:
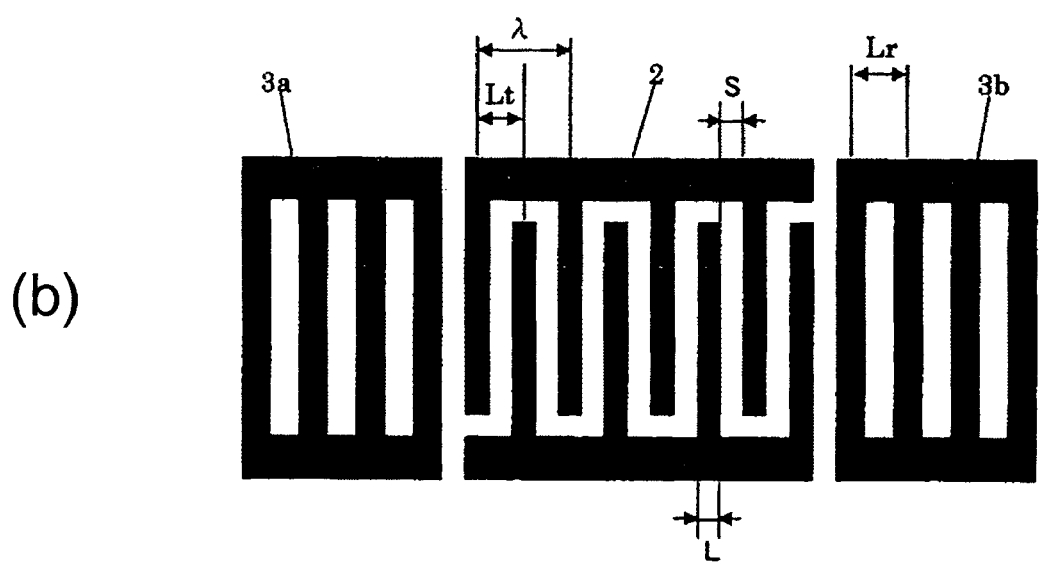

Embodiment of the invention will be described with reference to the accompanying drawings. FIG. 1(a) is a plan view of a SAW resonator which is an example of the SAW device according to the invention. The SAW resonator includes an IDT 2 having positive electrode fingers and negative electrode fingers that interdigitate each other and grating reflectors 3a, 3b that reflect SAW and are disposed at the both sides of the IDT 2 on a piezoelectric substrate 1. Input/output pads 4a, 4b of the IDT 2 are made electrically conductive with input/output terminals of a package 6 through metal wires 5a, 5b. An opening part of the package 6 is air-tightly sealed with a lid. The piezoelectric substrate 1 is a quartz flat plate where the cut angle "θ" of the rotated Y-cut quartz substrate is set in the range of −64.0°<θ<−49.3° counterclockwise with respect to the crystalline Z axis and the propagation direction of the SAW is set in a substantially perpendicular direction (90°±5°) to the crystalline X axis. The SAW excited here is the SH wave. Electrodes of the IDT 2 and the grating reflectors 3a, 3b are made of Al or Al-based alloy. FIG. 1(b) is an enlarged view of the IDT 2 and the grating reflectors 3a, 3b. in the drawing, "λ" denotes the wavelength of the SAW excited in the IDT 2, "Lt" denotes the electrode pitch of the IDT 2, "Lr" is the electrode pitch of the grating reflectors 3a, 3b, "L" is the width of the electrode finger, and "S" denotes a space between the two adjacent electrode fingers. In the following embodiment, the electrode film thickness "H" is represented by "H/λ" which is the film thickness normalized by the wavelength, a line occupancy ratio "mr" is represented by "L/(L+S)" (the electrode finger width/[the electrode finger width+ the space between the two adjacent electrode fingers]), and the ratio of the electrode pitch between the IDT and the reflector is denoted as "Lt/Lr".

According to the invention, the SAW device which was disclosed in Japanese Patent Application No. 2004-310452, more specifically the SAW device using the quartz crystal flat plate where the cut angle "θ" of the rotated Y-cut quartz substrate is set in −64.0°<θ<−49.3° counterclockwise with the crystalline Z-axis and the propagation direction of the SAW is set in substantially perpendicular direction (90°±5°) to the crystalline X-axis, has been improved by adjusting the ratio "Lt/Lr" optimally and squaring the peak frequency of the radiation conductance of the IDT with the peak frequency of the reflection coefficient of the reflector. In this way, the vibration energy can be efficiently confined and a high Q factor can be obtained.

Figure 2:
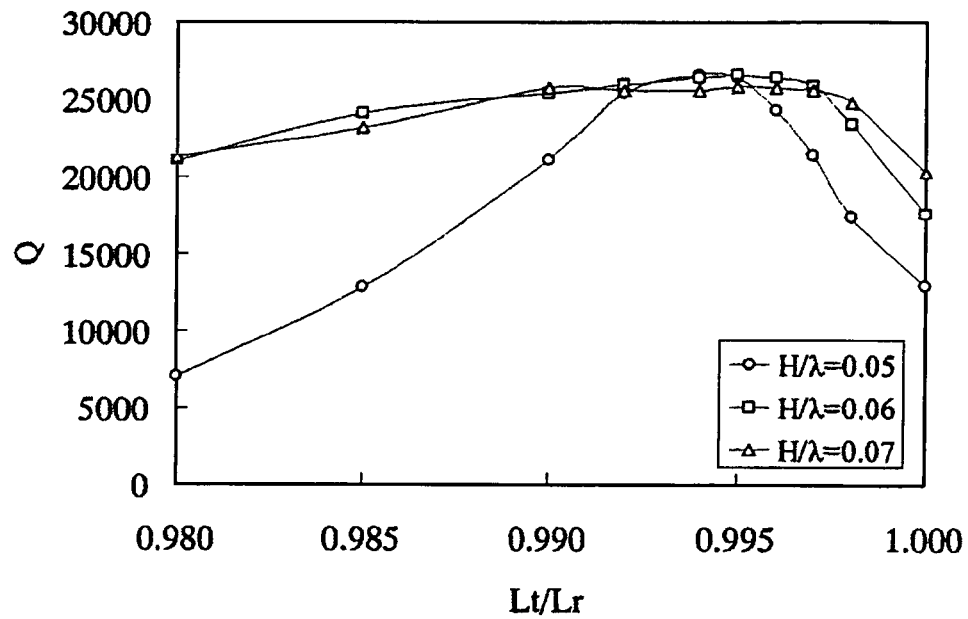
FIG. 2 is a graph showing a relation between a ratio "Lt/Lr" and a Q factor where a film thickness "H/λ" of the electrode is 0.05, 0.06 and 0.07 in the SAW device according to the invention.

FIG. 2 shows a relation between the ratio "Lt/Lr" and the Q factor where the electrode film thickness "H/λ" is 0.05, 0.06 and 0.07. Here, the SAW resonator in which the cut angle "θ" of the quartz crystal substrate is −52°±0.5°, the line occupancy ratio "mr" is 0.60, the number of the electrode pairs in the IDT 2 is 100, the number of the electrodes in the grating reflector 3a, 3b is 100 respectively and the resonance frequency is 315 MHz was fabricated. Experimental results of this SAW resonator are plotted. It can be understood from the graph that the Q factor reaches the maximum value of about 25,000 around the point where Lt/Lr=0.995, and the Q factor decreases as the ratio "Lt/Lr" becomes larger or smaller than 0.995 whatever the electrode film thickness is. Moreover, the high Q factor of 20,000 or higher can be obtained in the range of $0.990 \leq Lt/Lr \leq 0.997$ in the case where H/λ=0.05, in the range of $0.980 \leq Lt/Lr \leq 0.998$ in the case where H/λ=0.06, and in the range of $0.997 \leq Lt/Lr \leq 1.00$ in the case where H/λ=0.07. This happened possibly because the correction of "Lt/Lr" sets the peak frequency of the radiation conductance of the IDT in the range of the frequency where the reflection coefficient becomes large.

In the comparison of the multiple-pairs IDT type SAW resonator disclosed in JP-B-01-034411 with the SAW resonator according to the invention, the Q factor shown in JP-B-01-034411 is the value where the resonance frequency is 207.561 MHz. When the Q factor of JP-B-01-034411 is converted to the one corresponding to the resonance frequency of 315 MHz which the embodiment adopts, the Q factor becomes about 15,000 whereas the Q factor of the SAW device according to the embodiment is higher than 15,000. Therefore the Q factor of the SAW device according to the embodiment is larger than the Q factor which was obtained in JP-B-01-034411. In addition, in terms of the size, the multiple-pairs IDT type SAW resonator of JP-B-01-034411 had to have the electrode pairs as many as 800=200 whereas the IDT of the embodiment requires only 200 pairs for the both IDTs. Thereby it is possible to downsize the resonator significantly according the embodiment of the invention.

Figure 3:
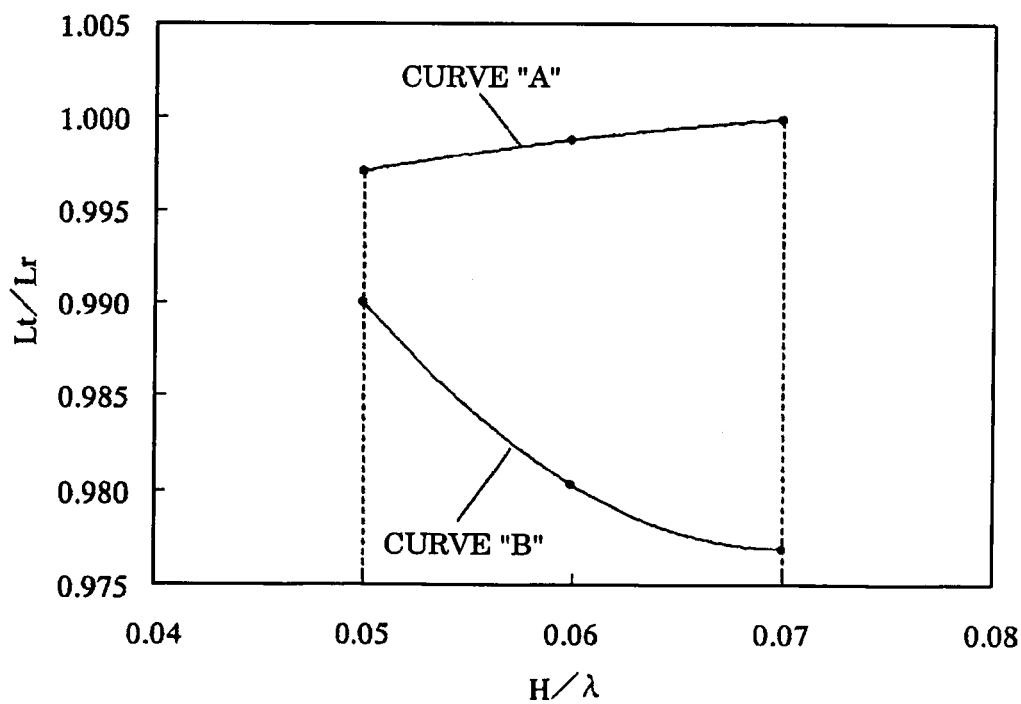
FIG. 3 is a graph showing the area of "H/λ" and "Lt/Lr" where the Q becomes 20,000 or higher in the SAW device according to the invention.
Figure 4:
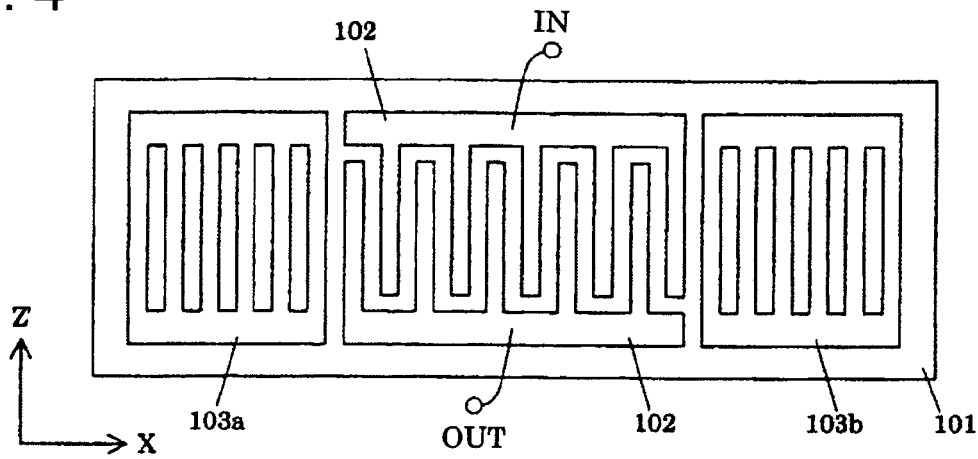
FIG. 4 is a plan view of a hitherto known ST-cut quartz crystal SAW resonator.
Figure 5:
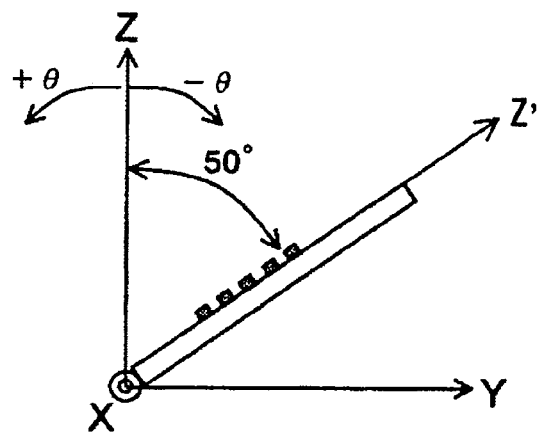
FIG. 5(a) is an elevation view of a −50° rotated Y-cut 90° X-propagation quartz crystal substrate.
FIG. 5(b) is a plan view of the substrate.
Figure 5:
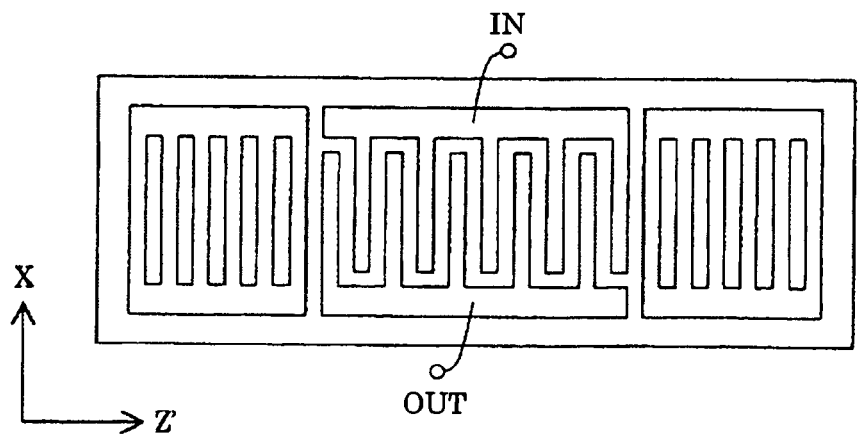
Figure 6:
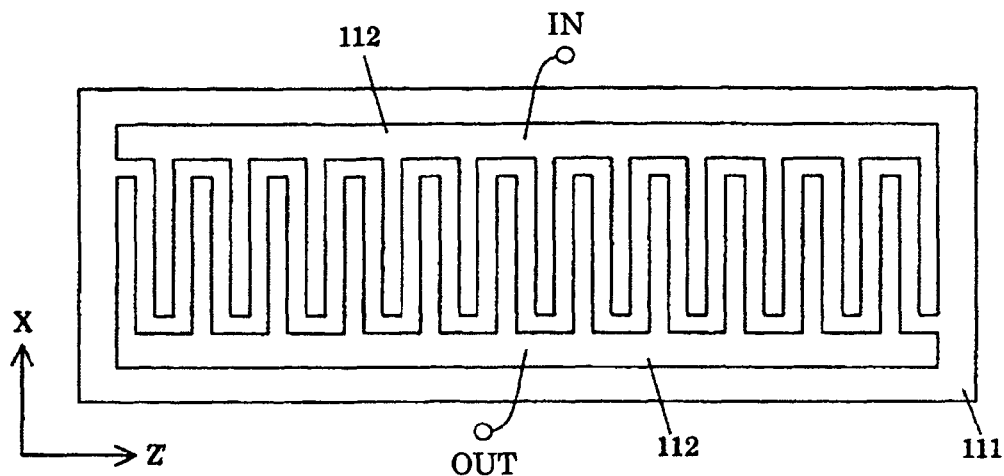
FIG. 6 is a plan view of a hitherto known multiple-pairs IDT type SAW resonator.
Figure 7:
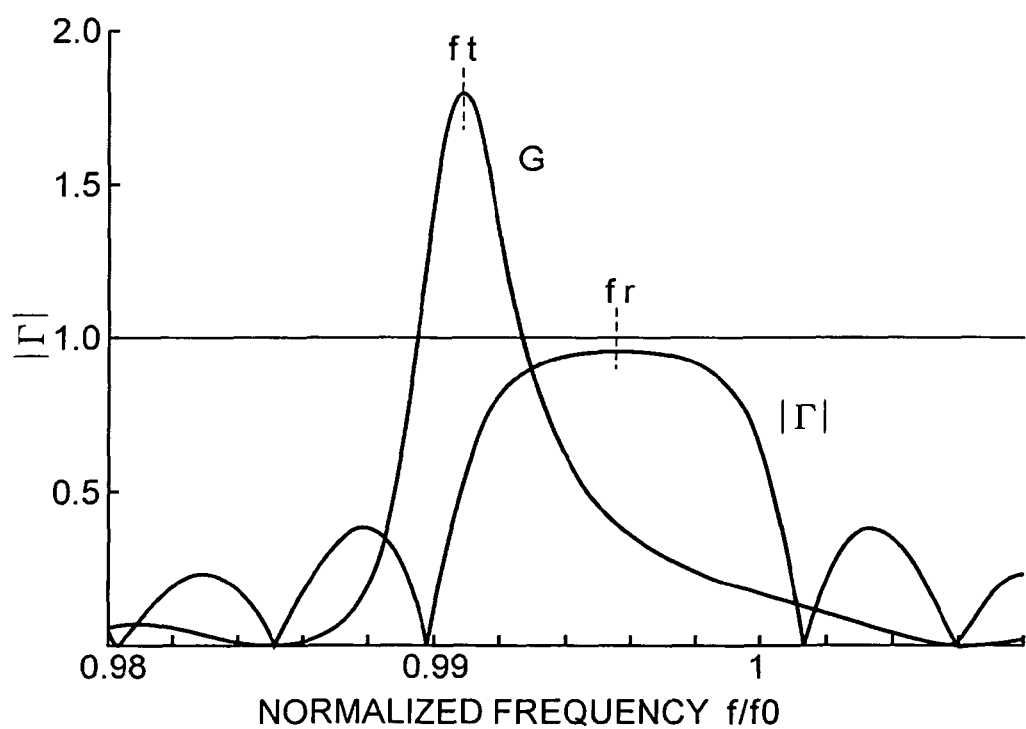
FIG. 7 is graph showing a frequency characteristic of a radiation conductance of an IDT and a reflection coefficient of a reflector.

FIG. 3 shows a graph where the upper limit and the lower limit of the "Lt/Lr" where the Q factor stays 20,000 or higher are plotted with the same conditions of the electrode film thickness "H/λ" shown in FIG. 2. Here an approximate expression of the upper limit of the "Lt/Lr" is given by the curve "A" and an approximate expression of the lower limit of the "Lt/Lr" is given by the curve "B". The curve "A" can be represented by the following formula: $Lt/Lr \approx -3.000 \times (H/\lambda)^2 + 0.500 \times (H/\lambda) + 0.9796$ The curve "B" can be represented by the following formula: $Lt/Lr \approx 31.50 \times (H/\lambda)^2 - 4.435 \times (H/\lambda) + 1.133$ It is possible to obtain the Q factor the curve "B" of 20,000 or higher by setting "Lt/Lr" in the region defined by the curve "A" and the curve "B". In other words, when $0.05 \leq H/\lambda \leq 0.06$, "Lt/Lr" and "H/λ" are set within the range of $31.50 \times (H/\lambda)^2 - 4.435 \times (H/\lambda) + 1.133 \leq Lt/Lr \leq -3.000 \times (H/\lambda)^2 + 0.5000 \times (H/\lambda) + 0.9796$ in order to obtain the high Q factor.

As described above, the SAW device according to the invention has the quartz crystal flat plate where the cut angle of the rotated Y-cut quartz substrate is set in −64.0°<θ<−49.3° counterclockwise with the crystalline Z-axis and the propagation direction of the SAW is set in substantially perpendicular direction (90°±5°) to the crystalline X-axis, where the electrode film thickness is $0.05 \leq H/\lambda \leq 0.07$, the ratio "Lt/Lr" is set to satisfy the following range: $31.50 \times (H/\lambda)^2 - 4.435 \times (H/\lambda) + 1.133 \leq Lt/Lr \leq -3.000 \times (H/\lambda)^2 + 0.5000 \times (H/\lambda) + 0.9796$ In this way, it is possible to downsize the SAW device and to obtain a higher Q factor compared to hitherto known SAW devices.

Moreover, as described in Japanese Patent Application No. 2004-310452, the peak temperature of the frequency-temperature characteristic can be set in a practical range of 0-70° C. when the cut angle of the rotated Y-cut quartz substrate is set in −61.4°<θ<−51.4° counterclockwise with respect to the crystalline Z-axis.

Though the case where the electrode film thickness "H/λ" is $0.05 \leq H/\lambda \leq 0.07$ was described above, it is possible to obtain a high Q-factor SAW device with other electrode film thickness as long as the "Lt/Lr" is set so as to satisfy the range of $31.50 \times (H/\lambda)^2 - 4.435 \times (H/\lambda) + 1.133 \leq Lt/Lr \leq -3.000 \times (H/\lambda)^2 + 0.5000 \times (H/\lambda) + 0.9796$. Though the line occupancy ratio "mr" is 0.60 in the above-described embodiment, the line occupancy ratio can be set in any other value. Though the electrode is made of Al or Al-based alloy in the above-described embodiment, the electrode can be made of other metals such as Ta, W, Au, Ag and the like and alloys thereof.

As for the device structure, the embodiment can be applied to other types of the device including a double port SAW resonator, a double mode SAW (DMS) filter that utilizes acoustic coupling of the SAW resonator, a ladder type SAW filter in which the SAW resonator is arranged by a serial arm and a parallel arm in a ladder pattern, a transversal type SAW filter in which an input IDT and an output IDT are arranged with a predetermined gap interposed therebetween, and the like in addition to the single-port SAW resonator described above with reference to FIG. 1.

The same advantageous effects as the above-described embodiment can be obviously obtained for other SAW devices such as the one in which a protection film made of $SiO_2$, anodized Al or the like is formed on the IDT and/or the grating reflector and the SAW device in which an adhesion layer is formed on the upper or lower part of the Al electrode or a metal thin film is formed in order to increase the withstand electric power. The SAW device according to the invention can be used in sensor devices, module devices, oscillation circuits and the like.

The SAW device according to the invention can have other structures in addition to the one in which the SAW chip is wire-boded with the package as shown in FIG. 1. For example the SAW device can have a flip-chip bonding (FCB) structure where an electrode pad of a SAW chip is coupled to a terminal of a package through a metal bump, a chip size package (CSP) structure where a SAW chip is bonded on a wiring substrate in a flip-chip manner and the periphery of the SAW chip is resin-sealed, a wafer level chip size package (WLCSP) structure where a package or a wiring substrate is made unnecessary by forming a metal layer or a resin layer on a SAW chip, or the like. An all quartz package (AQP) structure in which the quartz device is sandwiched and sealed between quartz crystal substrates or glass substrates can also be adopted. According to the AQP structure, it becomes a simple structure in which the crystal device is sandwiched between the quartz crystal substrates or glass substrates thereby packaging is not necessary and the device can be made thin. Moreover when the sealing is performed in a low melting point glass sealing manner or a direct bonding manner, the amount of gas emitted out from the adhesive can be reduced and the aging characteristic can be improved.

As described above, according to the invention, the SAW device has the quartz crystal flat plate where the cut angle "θ" of the rotated Y-cut quartz substrate is set in $-64.0° < θ < -49.3°$ and the propagation direction of the SAW is set at $90° \pm 5°$ with the crystalline X-axis. The SAW device also has the IDT and the grating reflectors whose electrode material is Al or Al-based alloy and in which the electrode film thickness "H/λ" normalized by the wavelength is $0.05 \leq H/λ \leq 0.07$, and the ratio of the electrode pitch between the IDT and the reflector "Lt/Lr" is set to satisfy the following range: $31.50 \times (H/λ)^2 - 4.435 \times (H/λ) + 1.133 \leq Lt/Lr \leq -3.000 \times (H/λ)^2 + 0.5000 \times (H/λ) + 0.9796$. In this way, it is possible to set the peak frequency of the radiation conductance of the IDT within the range of the reflection coefficient frequency of the reflector thereby it is possible to realize the SAW device which can achieve a higher Q factor. Furthermore, when this SAW device is applied to a module device, an oscillation circuit or the like, downsized and high-performance one can be realized.

The invention claimed is:

1. A surface acoustic wave (SAW) device, comprising:
a piezoelectric substrate;
at least one interdigital transducer (IDT) formed on the piezoelectric substrate; and
reflectors disposed at both sides of the IDT,
wherein the piezoelectric substrate is made of a quartz crystal flat plate where a cut angle "θ" of a rotated Y-cut quartz substrate is set in $-64.0° < θ < -49.3°$ with a crystalline Z axis and a propagation direction of the surface acoustic wave is set at $90° \pm 5°$ with a crystalline X axis, an excited wave is SH wave, an electrode film thickness "H/λ" normalized by a wavelength of the IDT is $0.05 \leq H/λ \leq 0.07$ where "λ" is a wavelength of the exciting SAW, and a ratio of an electrode pitch between the IDT and the reflector "Lt/Lr" is set in a range of $31.50 \times (H/λ)^2 - 4.435 \times (H/λ) + 1.133 \leq Lt/Lr \leq -3.000 \times (H/λ)^2 + 0.5000 \times (H/λ) + 0.9796$ where "Lt" is the electrode pitch of the IDT and "Lr" is the electrode pitch of the reflector.

2. The SAW device according to claim 1, wherein the IDT and the reflectors are made of Al or Al-based alloy.

3. A module comprising, the SAW device according to claim 1.

4. An oscillator comprising, the SAW device according to claim 1.

5. A module comprising, the SAW device according to claim 2.

6. An oscillator comprising, the SAW device according to claim 2.

* * * * *